(12) United States Patent
Bustin

(10) Patent No.: US 10,958,293 B1
(45) Date of Patent: Mar. 23, 2021

(54) SYSTEM AND METHOD FOR NEAR-LOSSLESS UNIVERSAL DATA COMPRESSION USING CORRELATED DATA SEQUENCES

(71) Applicant: GM GLOBAL TECHNOLOGY OPERATIONS LLC, Detroit, MI (US)

(72) Inventor: Ronit Bustin, Kfar Saba (IL)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 16/806,569

(22) Filed: Mar. 2, 2020

(51) Int. Cl.
| H03M 13/31 | (2006.01) |
| H03M 13/00 | (2006.01) |
| H03M 7/30 | (2006.01) |
| G06K 9/00 | (2006.01) |
| H04L 1/00 | (2006.01) |

(52) U.S. Cl.
CPC ........ *H03M 13/31* (2013.01); *G06K 9/00805* (2013.01); *H03M 7/6041* (2013.01); *H03M 13/6312* (2013.01); *H04L 1/0054* (2013.01)

(58) Field of Classification Search
CPC ............... H03M 7/6041; H03M 13/31; H03M 13/6312; G06K 9/00805
USPC ..................................................... 341/55–95
See application file for complete search history.

(56) References Cited

U.S. PATENT DOCUMENTS

| 6,393,075 | B1 * | 5/2002 | Xu ..................... H03M 13/3746 375/262 |
| 7,271,747 | B2 | 9/2007 | Baraniuk et al. | |
| 7,653,867 | B2 | 1/2010 | Stankovic et al. | |
| 7,779,326 | B2 * | 8/2010 | Stankovic ............... H03M 7/30 714/752 |
| 8,389,167 | B2 * | 3/2013 | Frost .................. H01M 8/04179 429/414 |
| 10,409,279 | B2 * | 9/2019 | Kwon ..................... G06N 7/005 |
| 2008/0320363 | A1 * | 12/2008 | He ...................... H03M 13/1102 714/758 |
| 2009/0313459 | A1 * | 12/2009 | Horvath ............. H03M 13/1111 712/225 |
| 2012/0097550 | A1 * | 4/2012 | Lockhart ................... C25B 9/00 205/628 |
| 2012/0191427 | A1 * | 7/2012 | Cianflone ........... F02D 41/0007 703/2 |

(Continued)

*Primary Examiner* — Lam T Mai
(74) *Attorney, Agent, or Firm* — Quinn IP Law

(57) ABSTRACT

A method of near-lossless universal data compression using correlated data sequences includes detecting first target surroundings via a first sensor, encoding a first data sequence indicative of the detected target surroundings, and communicating to an electronic controller, the encoded first data sequence. The method additionally includes detecting the first target surroundings via a second sensor, and encoding a second data sequence indicative of the target surroundings detected by the second sensor. The method also includes communicating the encoded second data sequence to the controller. The method additionally includes decoding, via the controller, the encoded first and second data sequences. The method also includes, via the controller, determining a statistical correlation between the decoded first and second data sequences and formulating a mapping function having reduced cardinality and indicative of the determined statistical correlation. Furthermore, the method includes feeding back the mapping function by the controller to the first processor.

20 Claims, 10 Drawing Sheets

(56) References Cited

U.S. PATENT DOCUMENTS

2017/0138237 A1* 5/2017 Li ............................. F02B 5/00
2017/0370261 A1* 12/2017 Sun ......................... F01N 3/208

\* cited by examiner

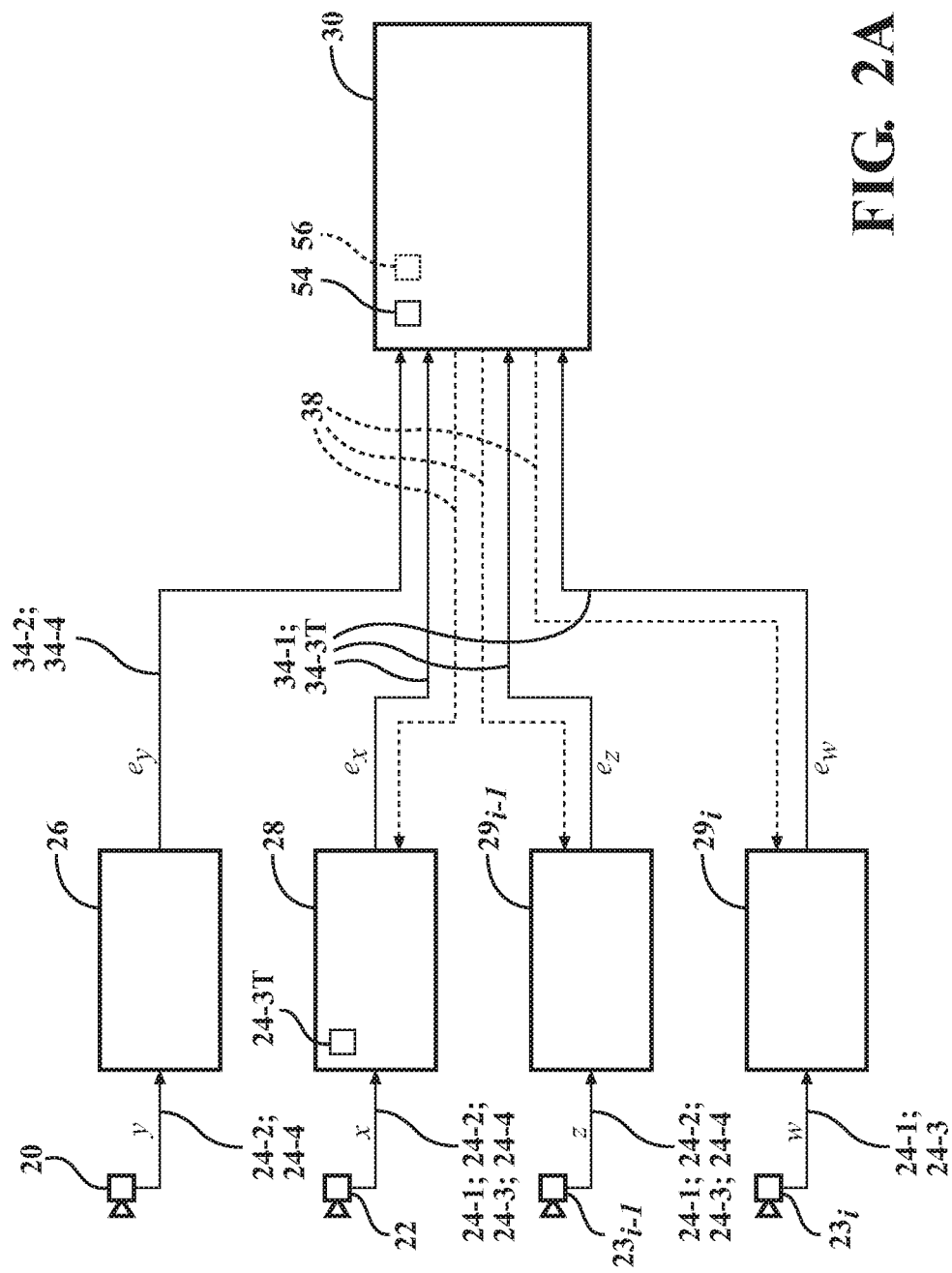

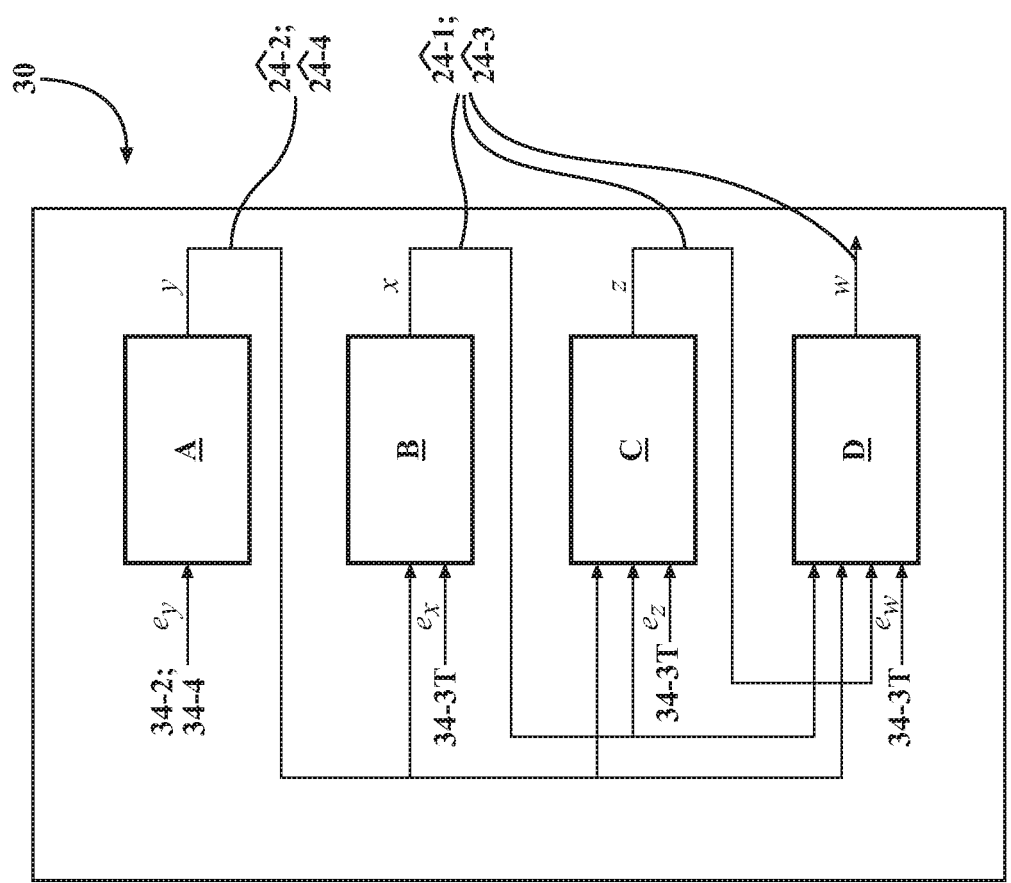

SYSTEM AND METHOD FOR NEAR-LOSSLESS UNIVERSAL DATA COMPRESSION USING CORRELATED DATA SEQUENCES

INTRODUCTION

The present disclosure relates to a system and method for near-lossless universal data compression using correlated data sequences generated by multiple data-sources. The subject system and method may be employed for guidance of an autonomous vehicle.

Vehicular automation involves the use of mechatronics, artificial intelligence, and multi-agent systems for perception of the vehicle surroundings and guidance to assist a vehicle's operator. Such features and the vehicles employing them may be labeled as intelligent or smart. A vehicle using automation for complex tasks, especially navigation, may be referred to as semi-autonomous. A vehicle relying solely on automation is consequently referred to as robotic or autonomous. Manufacturers and researchers are presently adding a variety of automated functions to automobiles and other vehicles.

Autonomy in vehicles is often categorized in discrete levels, such as Level 1—Driver assistance—where the vehicle may control either steering or speed autonomously in specific circumstances to assist the driver; Level 2—Partial automation—where the vehicle may control both steering and speed autonomously in specific circumstances to assist the driver; Level 3—Conditional automation—where the vehicle may control both steering and speed autonomously under normal environmental conditions, but requires driver oversight; Level 4—High automation—where the vehicle may complete a prescribed trip autonomously under normal environmental conditions, not requiring driver oversight; and Level 5—Full autonomy—where the vehicle may complete a prescribed trip autonomously under any environmental conditions.

Vehicle autonomy requires increasingly sophisticated perception systems, including various optical equipment and a multitude of sensors to detect objects and other obstacles surrounding the host vehicle, and on-board processors and software for interpretation of captured data. To enable vehicular automation, management of data processing resources is required to efficiently store, handle, and transmit large amounts of data captured by the subject sensors. Additionally, vehicle autonomy frequently includes artificial intelligence (AI) algorithms configured to assess incoming data from the subject sensors. Such AI algorithms may be employed to analyze and interpret data from independent, i.e., unlinked sensors to construct wide-angle and/or high-resolution images for autonomous driving.

In signal processing, the process of reducing the size of a data file, i.e., bit-rate reduction, is often referred to as data compression. Compression is useful because it reduces resources required to store, handle, and transmit data. In the context of data transmission, data compression is identified as source coding—encoding done at the source of the data before it is stored or transmitted. Data compression involves encoding information using fewer bits than the original representation. Compression may be either lossy or lossless.

Lossless compression generally reduces bits by identifying and eliminating statistical redundancy. No information is lost in lossless compression. By comparison, lossy compression reduces bits by removing unnecessary or less important information, but generally leads to lost information. Additionally, compression of data from a source being performed without prior knowledge of the source's data distribution is generally termed "Universal compression". Compression of data from multiple unlinked sources may be compressed separately and decompressed at a single decoder, which is generally termed "distributed compression".

SUMMARY

A method of near-lossless universal data compression using correlated data sequences generated by multiple sensors or data-sources includes detecting first target surroundings via a first sensor. The method also includes encoding a first data sequence indicative of the detected first target surroundings by a first processor. The method additionally includes communicating, by the first processor to an electronic controller, the encoded first data sequence. The method also includes detecting the first target surroundings via a second sensor, and encoding, via a second processor, a second data sequence indicative of the first target surroundings detected by the second sensor. The method additionally includes communicating, via the second processor, the encoded second data sequence to the electronic controller. The method also includes decoding, via the electronic controller, the encoded first data sequence and the encoded second data sequence. The method additionally includes determining, via the electronic controller, a statistical correlation between the decoded first data sequence and the decoded second data sequence and formulating, via the electronic controller, a mapping function having reduced cardinality and indicative of the determined statistical correlation. Furthermore, the method includes feeding back the mapping function by the electronic controller to the first processor.

The method may also include detecting second target surroundings via the first sensor, as well as transforming, via the first processor, a third data sequence indicative of the detected second target surroundings using the mapping function. Additionally, the method may include encoding, via the first processor, the transformed third data sequence.

The transformed third data sequence may be at a lower data cardinality as compared to the third data sequence, and thereby a size of the encoded transformed third data sequence may be smaller than a size of encoded third data sequence.

The method may also include detecting the second target surroundings via the second sensor and encoding a fourth data sequence, via the second processor, indicative of the second target surroundings detected by the second sensor. The method may additionally include communicating to the electronic controller the encoded fourth data sequence via the second processor and the encoded transformed third data sequence via the first processor. The method may further include decoding, via the electronic controller, the encoded transformed third data sequence and the encoded fourth data sequence, and determining, via the electronic controller, the third data sequence using the transformed third data sequence and the decoded fourth data sequence.

According to the method, encoding via the first processor may include using a context tree weighted (CTW) compression algorithm to construct an encoding primary context tree data structure, and decoding via the electronic controller may include using the CTW compression algorithm to construct a decoding primary context tree data structure. Additionally, determining the statistical correlation between the decoded first data sequence and the decoded second data sequence may include constructing, via the electronic controller, a decoding secondary context tree data structure from each leaf of the decoding primary context tree data structure.

According to the method, encoding each of the first data sequence and the third data sequence may include constructing respective first and third encoding primary context tree data structures, and encoding the first data sequence may be configured to generate a conditional likelihood ratio for each data symbol in the first data sequence. Transforming the third data sequence may use, at each leaf of the third encoding primary context tree data structure, the respective mapping function, which transforms the symbols of the third data sequence. Additionally, encoding the transformed third data sequence may be configured to generate a conditional likelihood ratio for each data symbol in the transformed third data sequence using the third encoding primary context tree data structure.

According to the method, decoding the encoded transformed third data sequence may include using the CTW compression algorithm to construct the decoding primary context tree data structure. Additionally, the third data sequence may include using the constructed decoding primary context tree data structure and the constructed decoding secondary context tree data structure for every leaf of the decoding primary context tree data structure.

According to the method, formulating the mapping function may include enumerating a number of appearances of a current data symbol in the first data sequence for a context of the first data sequence and a context of the second data sequence in a decoding secondary context tree data structure. Additionally, formulating the mapping function may include using the decoding secondary context tree data structure to achieve a target error probability. In turn, attaining the target error probability is intended to facilitate mapping multiple input symbols into a common bin, when, using each of the primary and secondary context tree data structures, the multiple input symbols are distinct from each other within an average, over the entire first data sequence, error probability that is less than or equal to the target error probability.

According to the method, decoding the encoded transformed third data sequence may include constructing the decoding primary context tree data structure, and determining the third data sequence may additionally include using the decoded fourth data sequence and the decoding secondary context tree data structure.

According to the method, determining the third data sequence may additionally include descending through the decoding primary context tree data structure to reach a leaf having the mapping function for mapping each data symbol in the third data sequence to a respective bin value in the transformed third data sequence. In such an instance, the method may also include descending through the secondary context tree data structure according to the current context of the decoded fourth data sequence to establish a value of a current data symbol in the third data sequence.

A system for near-lossless universal data compression using correlated data sequences generated by multiple data-sources and employing the above-described method is also disclosed.

The above features and advantages, and other features and advantages of the present disclosure, will be readily apparent from the following detailed description of the embodiment(s) and best mode(s) for carrying out the described disclosure when taken in connection with the accompanying drawings and appended claims.

BRIEF DESCRIPTION OF THE DRAWINGS

FIG. 2A is a schematic depiction of an embodiment of the data gathering and data sequence processing system using data-sources in excess of the first and second data-sources shown in FIG. 1 (along with corresponding processors), with the electronic controller providing cascaded or limited feedback to the additional data-sources.

FIG. 2B is a schematic depiction of the electronic controller having data processors corresponding to the data-sources shown in FIG. 2A.

DETAILED DESCRIPTION

Figure 1:
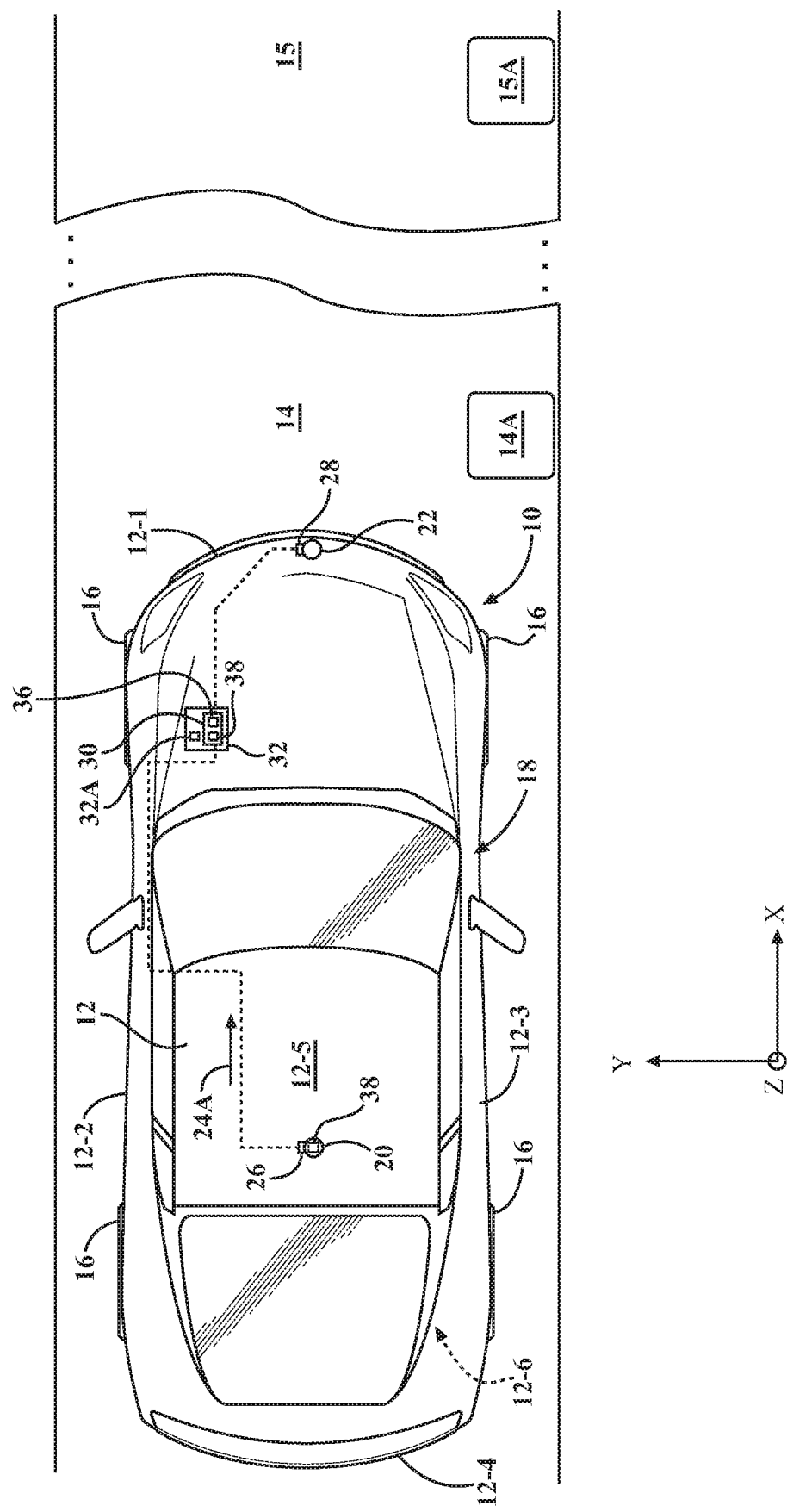
FIG. 1 is a plan view of an autonomous motor vehicle traversing a first terrain and, subsequently, a second terrain; the vehicle employing a data gathering and data sequence processing system using first and second data-sources with corresponding first and second processors (source encoders) and an electronic controller (decoder), according to the present disclosure.

Referring to the drawings, wherein like reference numbers refer to like components, FIG. 1 shows a schematic view of a motor vehicle 10, which is depicted as an autonomous vehicle arranged in the XYZ plane. The term "autonomous", as used herein, generally refers to the use of mechatronics, artificial intelligence, and multi-agent systems to provide varying levels of assistance to a vehicle's operator in controlling the subject vehicle. Such automation may include the entire range of assistance from the vehicle systems controlling either steering or speed autonomously in specific circumstances to assist the operator up to and including full automation which eschews operator involvement.

As shown, the autonomous motor vehicle 10 has a vehicle body 12. The vehicle body 12 may have a leading side or front end 12-1, a left body side 12-2, right body side 12-3, a trailing side or back end 12-4, a top side or section, such as a roof, 12-5, and a bottom side or undercarriage 12-6. The vehicle 10 may be used to traverse, for example at time t, a road surface within a specific first geographical area, defined herein as first target surroundings 14, which includes a specific landscape or terrain and associated physical objects, such as a first object 14A. The vehicle 10 may further traverse, for example at time t+1, another road surface within a second geographical area, defined herein as second target surroundings 15, which includes a different landscape or terrain and associated physical objects, such as a second object 15A. The vehicle 10 may include a plurality of road wheels 16. Although four wheels 16 are shown in FIG. 1, a vehicle with fewer or greater number of wheels, or having other means, such as tracks (not shown), of traversing the road surface or other portions of the first target surroundings 14 is also envisioned.

For example, and as shown in FIG. 1, the vehicle 10 may use a data gathering and processing system 18, which may be a perception and guidance system employing mechatronics, artificial intelligence, and a multi-agent system to assist the vehicle's operator. The data gathering and processing system 18 may be used to detect various objects or obstacles in the path of the vehicle 10. The system 18 may employ such features and various sources of data for complex tasks, especially navigation, to operate the vehicle 10 semi-autonomously, or rely solely on automation to operate the vehicle in a robotic or fully autonomous capacity.

As shown in FIG. 1, as part of the data gathering and processing system 18, a first vehicle sensor 20 and a second vehicle sensor 22 are arranged on the vehicle body 12 and used as sources of data to facilitate autonomous operation of the vehicle 10. Accordingly, the first autonomous vehicle 10 may be identified as a host vehicle to the first and second vehicle sensors 20, 22. Such vehicle sensors 20 and 22 may, for example, include acoustic or optical devices mounted to the vehicle body 12, as shown in FIG. 1. Specifically, such optical devices may be either emitters or collectors/receivers of light mounted to one of the vehicle body sides 12-1, 12-2, 12-3, 12-4, 12-5, and 12-6. The first and second vehicle sensors 20, 22 are depicted as part of the system 18, and may be part of other system(s) employed by the vehicle 10, such as for displaying a 360-degree view of the first target surroundings 14. Notably, although the first and second sensors 20, 22 are specifically disclosed herein, nothing precludes a greater number of individual sensors being employed by the data gathering and processing system 18.

Specifically, an optical device may be a laser beam source for a Light Detection and Ranging (LIDA) system, or a laser light sensor for an adaptive cruise control system or a camera capable of generating video files. In general, each of the first and second vehicle sensors 20, 22 is configured to detect the first target surroundings 14, and second target surroundings 15 including, for example, the respective first object 14A and second object 15A positioned external to the vehicle 10. Accordingly, the first and second vehicle sensors 20, 22 are configured to capture a raw first data set 24A gathered from the first and second target surroundings 14, 15.

Each of the first and second objects 14A and 15A may be inanimate, such as a tree, a building, a road or a traffic sign, an animal, or a person. The first target surroundings 14 and the second target surroundings 15 in the vicinity of the vehicle 10 may include multiple objects (shown in FIG. 1), such as the respective objects 14A and 15A, information regarding which may be used to assist with navigation of the subject vehicle 10. Each of the sensors 20, 22 may therefore be used to capture raw images and video data, from which specific information regarding various objects, e.g., the objects 14A and 15A, may be extracted via specific algorithms. The first and second sensors 20, 22 are also configured to communicate the captured data to respective data processors arranged on the vehicle 10, as will be described in detail below.

According to the present disclosure, the autonomous vehicle 10 generally enters the second target surroundings 15 after the vehicle 10 has exited the geographical area of the first target surroundings 14. The first sensor 20 operates as a primary data-source, and is configured to detect the first target surroundings 14 at time t, including capturing a raw first data set or first data sequence 24-1, representative thereof. The second sensor 22 operates as a secondary data-source, and is also configured to detect the first target surroundings 14, including capturing a raw second data set or second data sequence 24-2 representative thereof. The first and second sensors 20, 22 then repeat the same when the vehicle 10 enters the second target surroundings 15 at time t+1. Accordingly, the first sensor 20 captures a raw third data set or third data sequence 24-3 and the second sensor 22 captures a raw fourth data set or fourth data sequence 24-4, each representative of the second target surroundings 15. The raw first, second, third, and fourth data sequences 24-1, 24-2, 24-3, 24-4 may be video images gathered from the respective target surroundings 14 and 15. Specific data sequences are intended to be near-losslessly compressed and communicated within the vehicle 10 in a limited amount of time and with the most efficient usage of data storage, as will be described in detail below. Additionally, the subject data sequences may be used to display a 360-degree view of the first and second target surroundings 14, 15, as well as be inserted into a perception algorithm for semi-autonomous purposes.

The first and second sensors 20, 22 are also configured to transmit the respective data sequences 24-1, 24-2, 24-3, 24-4 gathered from the first and second target surroundings 14, 15 to corresponding first and second data processors 26, 28. As shown in FIG. 1, the first and second data processors 26, 28 are arranged on the vehicle 10 proximate the corresponding first and second sensors 20, 22. The first and second processors 26, 28 operate as source encoders configured to compress gathered raw data, and thus, each is operatively connected, and may be physically mounted, to the respective first sensor 20 and second sensor 22, i.e., the individual sources of captured raw data. Each of the processors 26, 28 includes a memory that is tangible and non-transitory. The respective memory of the processors 26, 28 may be a recordable medium that participates in providing computer-readable data or process instructions. Such a medium may take many forms, including either volatile or non-volatile media. The processors 26 and 28 may be small, purposely designed units for performing compression of gathered raw data. Each of the processors 26, 28 also employs an algorithm that may be implemented as an electronic circuit, such as a field-programmable gate array (FPGA), or saved to non-volatile memory. The compressed data produced by each of the processors 26, 28 may be used for real-time decoding and learning by an electronic controller, to be discussed in detail below, or sent to storage. Accordingly, the stored gathered raw data may not be decoded immediately, but rather at some later time (for example, for off-line learning).

The data gathering and processing system 18 as described herein is specifically configured to generate near-lossless universal compression of raw data by assessing correlation between various sets of data observed by individual sensors In general, data compression is useful because it reduces resources required to store, handle, and transmit the data. Computational resources are consumed in the compression process and, usually, in the reversal of the process (decompression). Data compression is subject to a space-time complexity trade-off. For instance, a compression scheme for video may require expensive hardware for the video to be decompressed fast enough to be viewed while it is being decompressed, as the option to decompress the video in full before the video is viewed may be inconvenient or require additional storage. Abstractly, a compression algorithm may be viewed as a function on sequences (normally of octets or bytes). Compression is successful if the resulting sequence is shorter than the original sequence (and the instructions for the decompression map). As specifically contemplated by the present disclosure, "universal compression" is source coding that permits data to be compressed with no prior knowledge of the data-source's distribution. In information technology, data compression may be lossy or lossless.

Lossless compression is a class of data compression algorithms that allows the original data to be perfectly reconstructed from the compressed data, i.e., does not degrade the data, which permits the compression to be reversed. By contrast, the amount of data reduction possible using lossy compression is typically significantly higher than through lossless techniques, but such compression is irreversible. Lossy compression frequently uses a technique of partial data discarding and permits reconstruction only of an approximation of the original data to represent the content, which typically results in lost information. Specific designs of data compression schemes involve trade-offs among various factors, including the degree of compression, the amount of distortion introduced (when using lossy data compression), and the computational resources required to compress and decompress the data.

The data gathering and processing system 18 additionally includes a programmable electronic controller 30. As shown in FIG. 1, the controller 30 is arranged on the autonomous vehicle 10 and may be integral to a central processing unit (CPU) 32. As depicted, the controller 30 operates as a decoder for the captured raw data received from the respective first and second processors 26, 28. The controller 30 may also be configured to use the captured raw data for various purposes such as to establish a 360-degree view of the first target surroundings 14, to execute perception algorithms, etc. Generally, after the first and second processors 26, 28 separately and independently compress corresponding raw data, the electronic controller 30 then decompresses the separately compressed data.

The controller 30 is specifically configured to provide limited feedback, i.e., unrelated to the size of the raw or encoded data, to the first vehicle sensor 20 based on determined spatial correlation between the raw data captured by the first and second vehicle sensors 20, 22, to facilitate near-lossless universal compression of the third data sequence 24-3. The subject feedback is specifically configured to assist the first vehicle sensor 20 improving data compression without added latency. In the event the number of vehicle sensors exceeds the first and second sensors 20, 22, such as including sensors $23_{i-1}$, $23_i$ (shown in FIG. 2A), (along with corresponding processors, such as processors $29_{i-1}$, $29_i$), the suggested solution may be cascaded. For example, using the example of FIGS. 2A and 2B, the electronic controller 30 may provide limited feedback to the processor $29_i$ based on determined spatial correlation between the subject sensor's raw data and the raw data of the other sensors (first sensor 20 to sensor $23_{i-1}$). In such a case, the structure of the electronic controller 30 will be as shown in FIG. 2B, where the first sequence is decoded losslessly (depicted in box A) producing the sequence y, while the second sequence will be decoded with y as input in box B, producing the sequence x. The third sequence will be decoded with both x and y as inputs in box C, producing sequence z. Finally, in box D the fourth sequence is decoded with x, y, and z as inputs, producing sequence w.

The controller 30 includes a memory that is tangible and non-transitory. The memory may be a recordable medium that participates in providing computer-readable data or process instructions. Such a medium may take many forms, including but not limited to non-volatile media and volatile media. Non-volatile media used by the controller 30 may include, for example, optical or magnetic disks and other persistent memory. The controller 30 includes an algorithm that may be implemented as an electronic circuit, e.g., FPGA, or as an algorithm saved to non-volatile memory. Volatile media of the controller 30 memory may include, for example, dynamic random-access memory (DRAM), which may constitute a main memory.

The controller 30 may communicate with the respective processors 26, 28 via a transmission medium, including coaxial cables, copper wire and fiber optics, including the wires in a system bus coupling a specific controller to an individual processor. Memory of the controller 30 may also include a flexible disk, hard disk, magnetic tape, other magnetic medium, a CD-ROM, DVD, other optical medium, etc. Controller 30 may be equipped with a high-speed primary clock, requisite Analog-to-Digital (A/D) and/or Digital-to-Analog (D/A) circuitry, input/output circuitry and devices (I/O), as well as appropriate signal conditioning and/or buffer circuitry. Algorithms required by the controller 30 or accessible thereby may be stored in the controller memory and automatically executed to provide the required functionality.

Controller 30 may be configured, i.e., structured and programmed, to receive and process captured raw data signals gathered by the respective first and second sensors 20, 22. The controller 30 may also perform the decoding, i.e., decompression, and then transfer the raw captured data to additional algorithms, such as algorithms constructed to generate a 360-degree view or a perception of objects 14A, 15A and other items within the first and second target surroundings 14, 15. For exemplary purposes, the CPU 32 is specifically programmed with perception software 32A that may include an artificial intelligence (AI) algorithm configured to assess incoming data from the respective first and second sensors 20, 22. The CPU 32 may be configured to perform additional processing of the data, for example integrate several images into the 360-degree view or generate perception algorithms for autonomous driving. The perception software 32A would be generally configured to analyze and interpret the physical parameter data from the respective sensors 20, 22. For example, the perception software 32A may be configured to define a positioning of objects 14A and 15A in the X-Y-Z coordinate system (shown in FIG. 1) and identify the respective objects using a pre-trained AI algorithm.

According to the present disclosure, the first processor 26 is specifically configured to encode the first data sequence 24-1 including a first data symbol $x_n$ (where "n" is the last encoded/decoded symbol), indicative of the first target surroundings 14 detected by the first sensor 20, and thereby generate an encoded first data sequence 34-1. The first processor 26 is also configured to communicate the encoded first data sequence 34-1 to the electronic controller 30. Similarly, the second processor 28 is configured to encode the second data sequence 24-2 including a second data symbol $y_n$, indicative of the first target surroundings 14 detected by the second sensor 22, and thereby generate an encoded second data sequence 34-2 (i.e., the subject data sequence is constructed from symbols that are denoted as written). The second processor 28 is also configured to communicate the encoded second data sequence 34-2 to the electronic controller 30.

Figure 3:
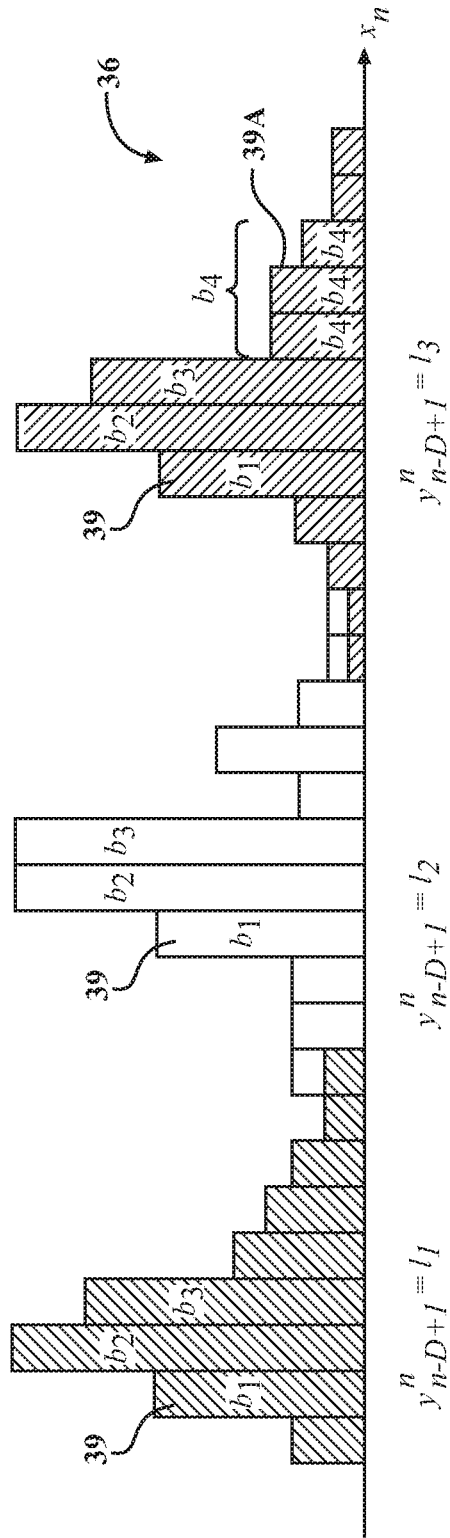
FIG. 3 is a schematic depiction of data symbols extracted from gathered data being mapped into discrete bins by the data gathering and data sequence processing system shown in FIG. 1, according to the present disclosure.

The electronic controller 30 is configured to decode the received encoded first data sequence 34-1 and the encoded second data sequence 34-2, and then determine a statistical correlation 36 between the decoded first and second data sequences. The electronic controller 30 is additionally configured to formulate and define a mapping or binning function 38 having reduced cardinality and indicative of the determined statistical correlation 36 (shown in FIG. 3). The electronic controller 30 is further configured to feed back the mapping function 38 to the first processor 26. After the first sensor 20 has detected the second target surroundings 15 and generated the third data sequence 24-3 (denoted also as $x_{t+1}^M$, where "M" is the length of the entire sequence and the iteration is denoted by "t") indicative of the detected second target surroundings, the first sensor uses the mapping function 38 to transform the third data sequence, i.e., generate the transformed third data sequence 24-3T (also denoted as $z_{t+1}^M$).

Based on the determined statistical correlation 36 between the decoded first and second data sequences, the binning function 38 is intended to determine the required maximum number of bins 39 or data inputs at the first processor 26. Accordingly, the first processor 26 may apply the mapping function 38 to the third data sequence 24-3, to thereby transform the third data sequence 24-3 and generate a transformed third data sequence 24-3T, which includes a data sequence $z_{t+1}^M$ that is the transformation or binned value of the sequence $x_{t+1}^M$. The transformed third data sequence 24-3T is intended to be at a lower data cardinality as compared to the third data sequence 24-3. The first processor 26 is then configured to encode the transformed third data sequence 24-3T', and thereby generate an encoded or universally compressed transformed third data sequence 34-3T. As a result, the size of the encoded transformed third data sequence 34-3T may, be smaller than the size of an encoded third data sequence 34-3, if instead the third data sequence would have been encoded by the first processor 26. Accordingly, the encoded transformed third data sequence 34-3T represents a compressed embodiment of the third data sequence 24-3. The first processor 26 may then be configured to communicate the encoded transformed third data sequence 34-3T to the electronic controller 30.

The second sensor 22 may also be configured to detect the second target surroundings 15 and generate the raw fourth data sequence 24-4 indicative of the detected second target surroundings and including a data sequence $y_{t+1}^M$. The second processor 28 may encode the fourth data sequence 24-4, and then communicate thus encoded fourth data sequence 34-4 to the electronic controller 30. The electronic controller 30 may then decode the encoded transformed third data sequence 34-3T and the encoded fourth data sequence 34-4, and subsequently use the decoded transformed third data sequence $2\widehat{4-3}$ T and the decoded fourth data sequence $2\widehat{4-4}$ T together to determine the third data sequence 24-3. Although the decoded fourth data sequence is herein denoted by $2\widehat{4-4}$ T, in decoding the fourth data sequence 24-4 lossless reconstruction may be achieved, such that 24-4=$2\widehat{4-}$ 4.

Figure 4:
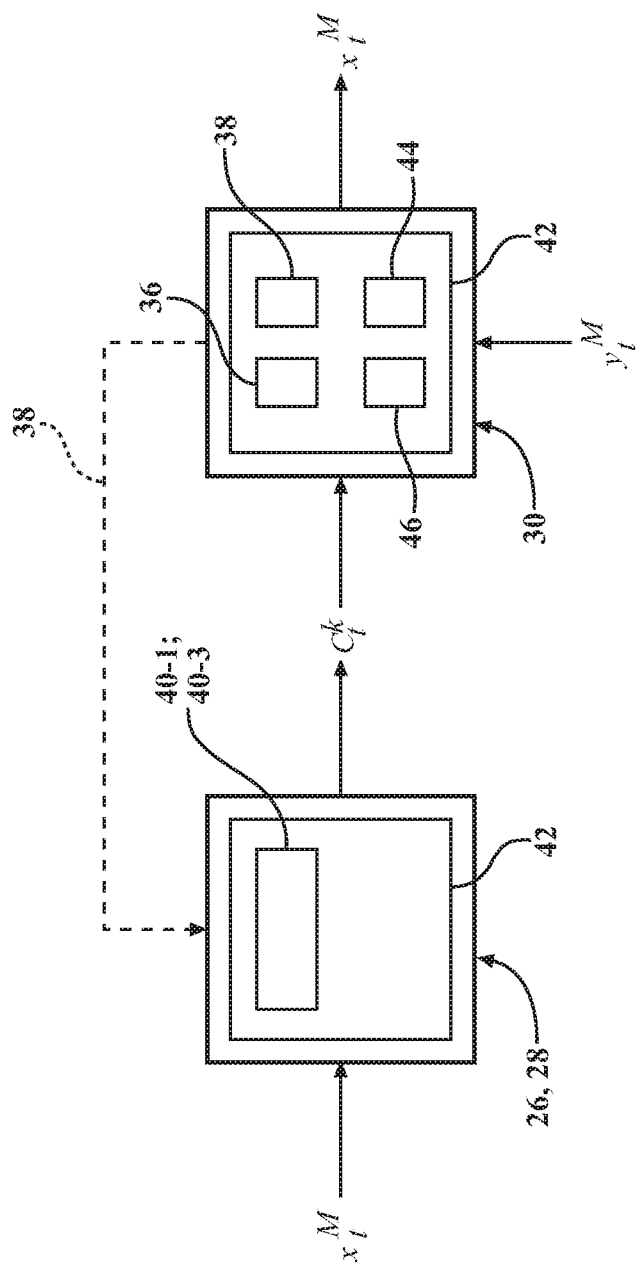
FIG. 4 is a general depiction of the data sequence processing system configured to near-losslessly encode (compress) and decode (decompress) raw data, exemplified by a first data sequence $x_t^M$ gathered by the first data-source and a second data sequence $y_t^M$ gathered by the second data-source (where "M" is the length of the entire sequence, and the iteration is denoted by "t").

As shown in FIG. 4, each of the first processor 26, the second processor 28, and the electronic controller 30 may include a context tree weighted (CTW) compression algorithm 42. The basic CTW compression algorithm 42 was developed by Willems, Shtrakov, and Tjalkens in 1995, and uses of the Krichevsky-Trofimov estimator, which is generally referenced as "KT 1981". In information theory, given an unknown stationary source 7C with alphabet A and a sample range from π, the KT 1981 estimator produces a probability estimate $P_e$, or $P_e(w)$ estimator of the probability of each symbol e∈A. $P_e(w)$ is an estimator of the subsequence w of independent symbols. Hence, it is a function of enumerations, i.e., the number of times each symbol appeared in w. The $P_e(w)$ estimator may be calculated sequentially and has a lower bound that allows to upper bound "parameter redundancy", uniformly for each θ in the expression below. The context tree data structure 134 facilitates the above advantages of the KT estimator. For a binary alphabet and a string w with m zeroes and n ones, the KT estimator $P_e(w)$ is defined as:

$$P_e(m, n) = \int_0^1 \frac{1}{\pi\sqrt{(1-\theta)\theta}} (1-\theta)^m \theta^n d\theta$$

and the sequential calculation is as follows (wherein $P_e(0, 0)=1$):

$$P_e(m+1, n) = \frac{m+1/2}{m+n+1} P_e(m, n)$$

$$P_e(m, n+1) = \frac{n+1/2}{m+n+1} P_e(m, n)$$

To encode the first data sequence 24-1, the first processor 26 may be configured to construct an encoding primary context tree data structure using the CTW compression algorithm 42 (shown in FIG. 4) for each of the first data sequence 24-1 and the third data sequence 24-3. Specifically, a first encoding primary context tree data structure 40-1 (shown in FIG. 5) may be constructed for the first data sequence 24-1 and a third encoding primary context tree data structure 40-3 may be constructed for the third data sequence 24-3. As shown, the first encoding primary context tree data structure 40-1 includes context nodes 40-1A and a corresponding leaf structure 48-1, while the third encoding primary context tree data structure 40-3 includes context nodes 40-3A and a corresponding leaf structure 48-3 (shown in FIG. 5).

The first encoding primary context tree data structure 40-1 and the third encoding primary context tree data structure 40-3 may be updated after observing the $n^{th}$ input symbol $x_n$, or $x_{n+1}$, respectively. Updating the first encoding primary context tree data structure 40-1 and the third encoding primary context tree data structure 40-3 may be accomplished according to the data sequences $x_t^{n-1}$, or $x_{t+1}^{n-1}$ and $x_{t+1}^{n-1}$, respectively, and specifically according to the last encoded data symbol $x_n$, or $x_{n+1}$ and $z_{n+1}$, respectively.

Figure 6:
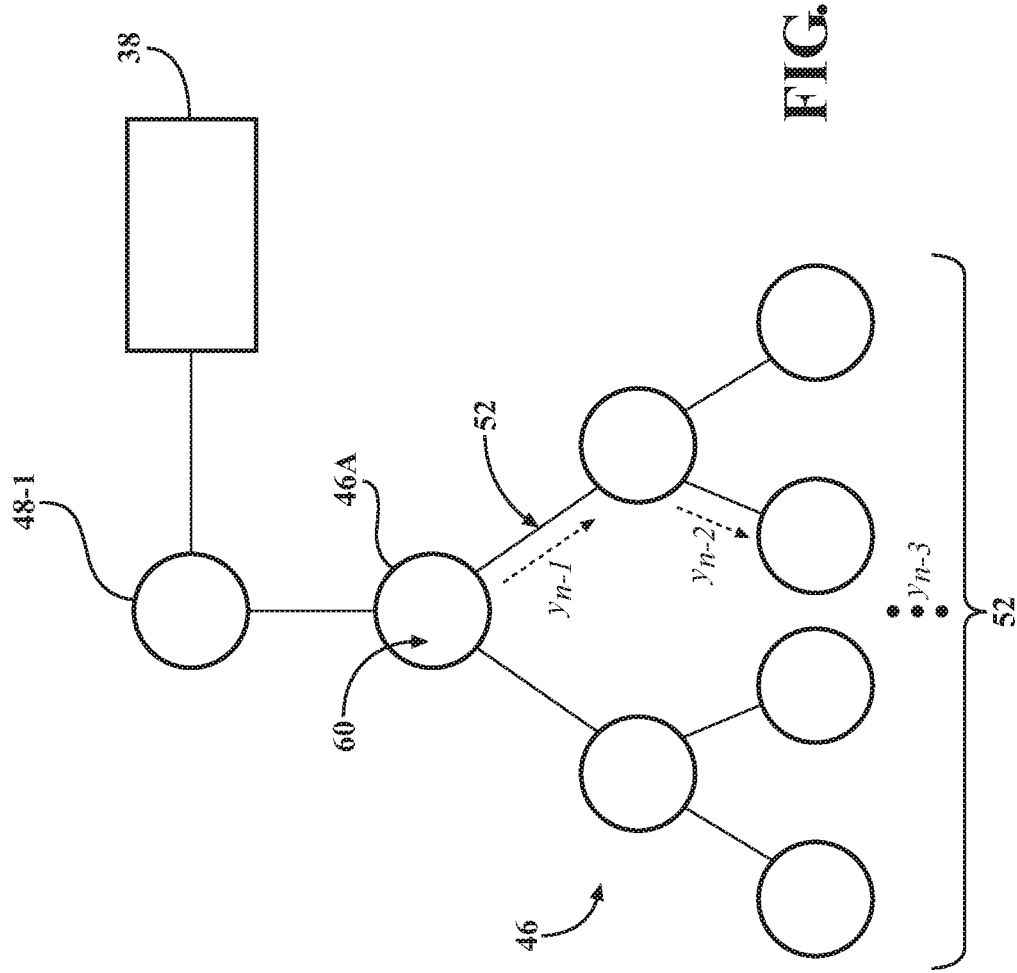
FIG. 6 is a depiction of evaluation of appearance of a symbol $x_n$ (where "n" is the last encoded/decoded symbol) in the context of a secondary sequence $y_{n-D+1}^n$ at each node of a secondary CTW data structure constructed from the leaves of the primary CTW data structure in the electronic controller for use in the compression algorithm of the decoder.

To decode the encoded first data sequence 34-1, encoded second data sequence 34-2, encoded transformed third data sequence 34-3T, and encoded fourth data sequence 34-4, the electronic controller 30 may use the CTW compression algorithm 42 to construct a decoding primary context tree data structure 44 and decoding secondary context tree data structures 46 (shown in FIG. 6), The electronic controller 30 may then retain in its memory each of the decoding primary context tree data structure 44 and the decoding secondary context tree data structures 46 for decoding the received data sequences and determining the mapping functions 38 for subsequent encoding iterations, respectively. Generally, the constructed decoding primary context tree data structure 44 includes context nodes 44A with corresponding leaf structures 50 (FIG. while the constructed decoding secondary context tree data structure 46 includes a context node 46A with corresponding leaf structures 52 (FIG. 6). Specifically, the electronic controller 30 may be configured to determine the statistical correlation 36 between the decoded first data sequence $2\widehat{4-}1$ (wherein an assumption is made that $2\widehat{4-}1$=24-1, since encoding and decoding is performed using the standard CTW algorithm, which is lossless) and the decoded second data sequence $2\widehat{4-}2$ (wherein $2\widehat{4-}2 \approx 24$-2), by constructing the decoding secondary context tree data structure 46 from each leaf 50 of the decoding primary context tree data structure 44. The decoding secondary tree data structure 46 is then used for determining the mapping functions 38, i.e., the statistical correlation 36, and decoding the respective data sequences.

The decoded first and second data sequences $2\widehat{4-}1$, $2\widehat{4-}2$ are examined and enumerated in the decoding secondary tree data structures 46 to determine the statistical correlation. The mapping functions 38 are then determined according to a target error probability, as will be explained below. Also, while the decoding primary context tree data structure 44 is used to determine the transformed third data 24-3T, the decoding secondary context tree data structures 46 and the decoded fourth data sequence $2\widehat{4-}4$ are used to determine the decoded third data $2\widehat{4-}3$. The electronic controller 30 may use the decoding secondary tree data structures 46 to perform both operations, determining the mapping functions 38 and decoding the data sequences, simultaneously, by holding two sets of enumeration values at each context tree node. One set of enumeration values may be held for the current enumeration, for updating the mapping functions in the subsequent, i.e., next, iteration. The second set of enumeration values may be held for the previous enumeration (values that were used to determine the current mapping functions 38) to be used for the current decoding, as the best estimate of the third data sequence 24-3 from its transformed version 24-3T. Alternatively, if the respective sequences are jointly ergodic (have the same behavior averaged over time, as averaged over the space of the sequences' states in their various phases) and stationary, the electronic controller 30 may employ a single enumeration at each context tree node. In such an embodiment, the corresponding decoding may be based on the subject enumeration's current value.

Figure 7:
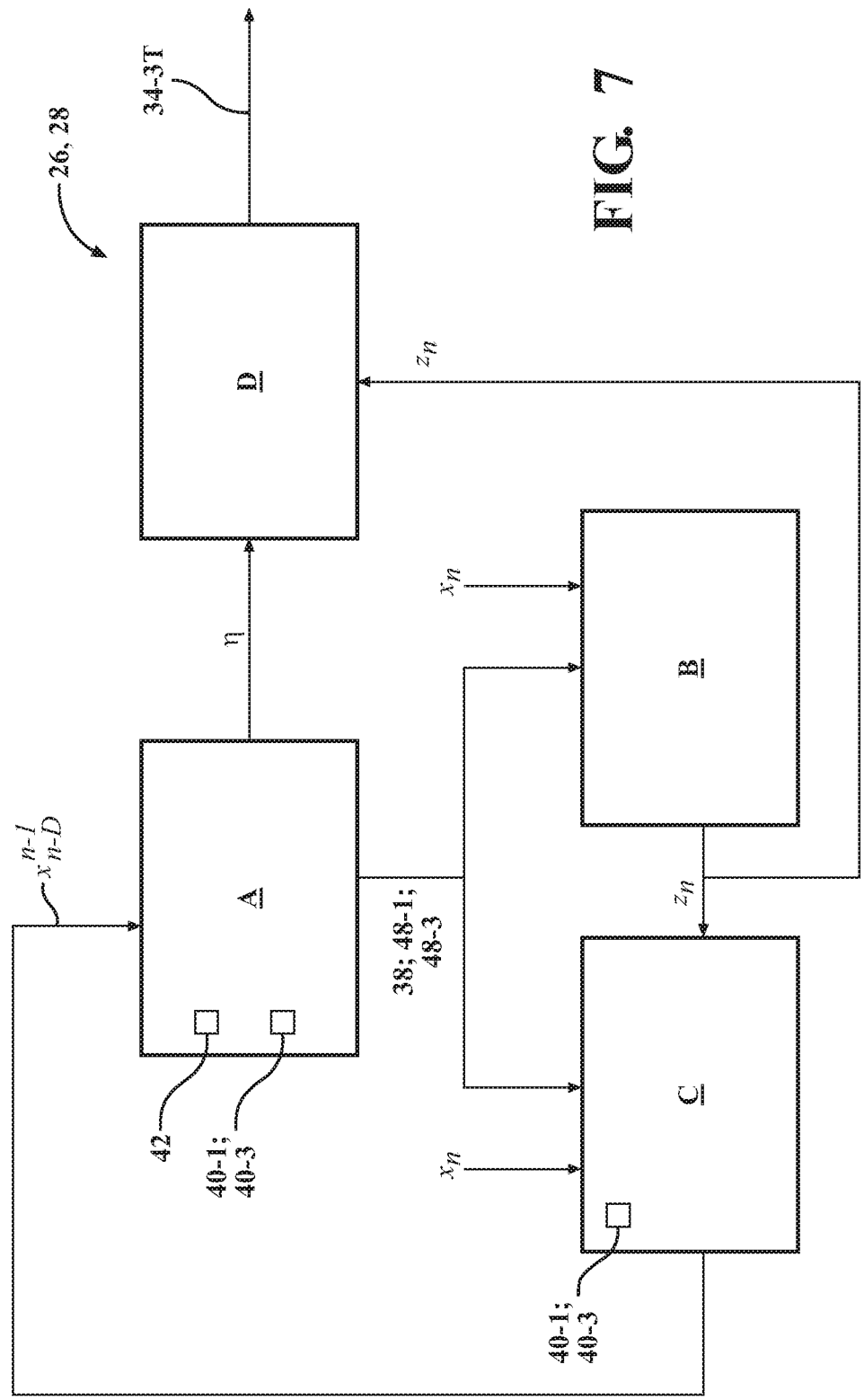
FIG. 7 is a schematic depiction of the first encoder constructing an encoding primary CTW data structure and generating likelihood vectors, shown in FIG. 5, according to the disclosure.

As noted above, to encode each of the first data sequence 24-1 and the third data sequence 24-3, the first processor 26 may construct respective first encoding primary context tree data structure 40-1 and third encoding primary context tree data structure 40-3. Additionally, in the process of encoding the first data sequence 24-1, the first processor 26 may generate a conditional likelihood ratio R for each possible subsequent data symbol in the first data sequence. The first processor 26 may transform the third data sequence 24-3 by employing the respective mapping function 38 at each leaf 48-3, i.e., reaching the respective leaf in box A of FIG. 7, of the third encoding primary context tree data structure 40-3 to thereby transform each symbol of the third data sequence, which occurs in box B of FIG. 7. The first processor 26 may then encode the transformed third data sequence 24-3T using the third encoding primary context tree data structure 40-3 to generate a conditional likelihood ratio $R_T$ for each data symbol $z_n$ in the transformed third data sequence 24-3T. The first processor 26 may thereby produce a likelihood vector "η" (in box A of FIG. 7, for each possible value of $z_n$) of ratios of conditional probabilities of data symbol $z_n$ in the context of the data sequence $x_{t+1}^{n-1}$, as shown in FIG. 7. The exact value $z_n$ is known only in box B of FIG. 7. This value of $z_n$ is actually determined by mapping in the respective leaf that has been reached in box A. The update of the context tree data structure is accomplished from a respective leaf upwards in the tree, using the determined $z_n$ value and the actual value $x_n$. This is accomplished in box C, as in a standard CTW compression algorithm 42, however using both $z_n$ and $x_n$ values, rather that only the value of $x_n$. Note that box D shown in FIG. 7 is simply an arithmetic encoder configured to take in the likelihood vector η and the symbol $z_n$ and continuously produce the encoding sequence.

The decoding secondary context tree data structure 46 is specifically used to determine the mapping function 38 and the data cardinality indicative of the determined statistical correlation 36. As will be described in detail below, a target error probability (probability of decoding error) may be used to address a trade-off between a compression ratio of the data and the probability of error. The decoding secondary context tree data structure 46 formulates the dependency between the first data sequence 24-1 and the second data sequence 24-2 (by observing their decoded versions, $2\widehat{4-}1$ and $2\widehat{4-}2$, which are approximately equal to their respective originals). In a given context of the first data sequence 24-1, the sequence having the data symbol $x_n$, generally appears in some contexts of second data sequence 24-2, but not in others. Therefore, the generated binning function 38 indicative of the statistical correlation 36 may be used to minimize the number of bins 39, to maximize the compression rate, given a constraint average probability of decoding error.

The electronic controller 30 may be programmed to determine the $z_n$ data symbol in the transformed third data sequence 24-3T using the CTW compression algorithm 42 in the standard manner. In other words, the likelihood vector η is determined in box A of FIG. 8, while box D operates as the arithmetic decoder, and together boxes A and D of FOG. 8 produce the value of $z_n$, assuming the context was without error. However, when the mapping function 38 is used to determine the particular data symbol $x_n$ in the third data sequence 24-3, the value of the $z_n$ data symbol in the transformed third data sequence 24-3T may correspond to one of several data symbols $x_n$. In order to determine the particular value of the data symbol $x_n$, the controller 30 may assess the decoding secondary context tree data structure 46 to determine which value of the subject data symbol $x_n$ is more likely according to the secondary context (accomplished in box B of FIG. 8, wherein the value of $z_n$ and the current leaf in the primary context tree data structure is used to descend the corresponding secondary tree to determine the value of $x_n$). Following the determination of the data symbol $x_n$ value, electronic controller 30 may also update the decoding primary context tree data structure 44 (shown in FIG. 8) and the secondary context tree data structure 46 (shown in FIG. 8) using the decoded third data sequence $2\widehat{4-}3$ according to the next inputs $x_n$, $z_n$, which is accomplished in box C of FIGS. 2B and 7.

In line with the above, the electronic controller 30 may be further configured to decode the encoded transformed third data sequence 34-3T using the CTW compression algorithm 42 to construct the decoding primary context tree data structure 44. The electronic controller 30 may then determine the third data sequence 24-3 using the constructed decoding primary context tree data structure 44 and the constructed decoding secondary context tree data structure 46 for each leaf 50 of the decoding primary context tree data structure 44. More specifically, to decode the encoded transformed third data sequence 34-3T the electronic controller 30 may construct the decoding primary context tree data structure 44, and then additionally use the decoded fourth data sequence $2\widehat{4-}4$ and the decoding secondary context tree data structures 46 to determine the decoded third data sequence $2\widehat{4-}3$.

Figure 8:
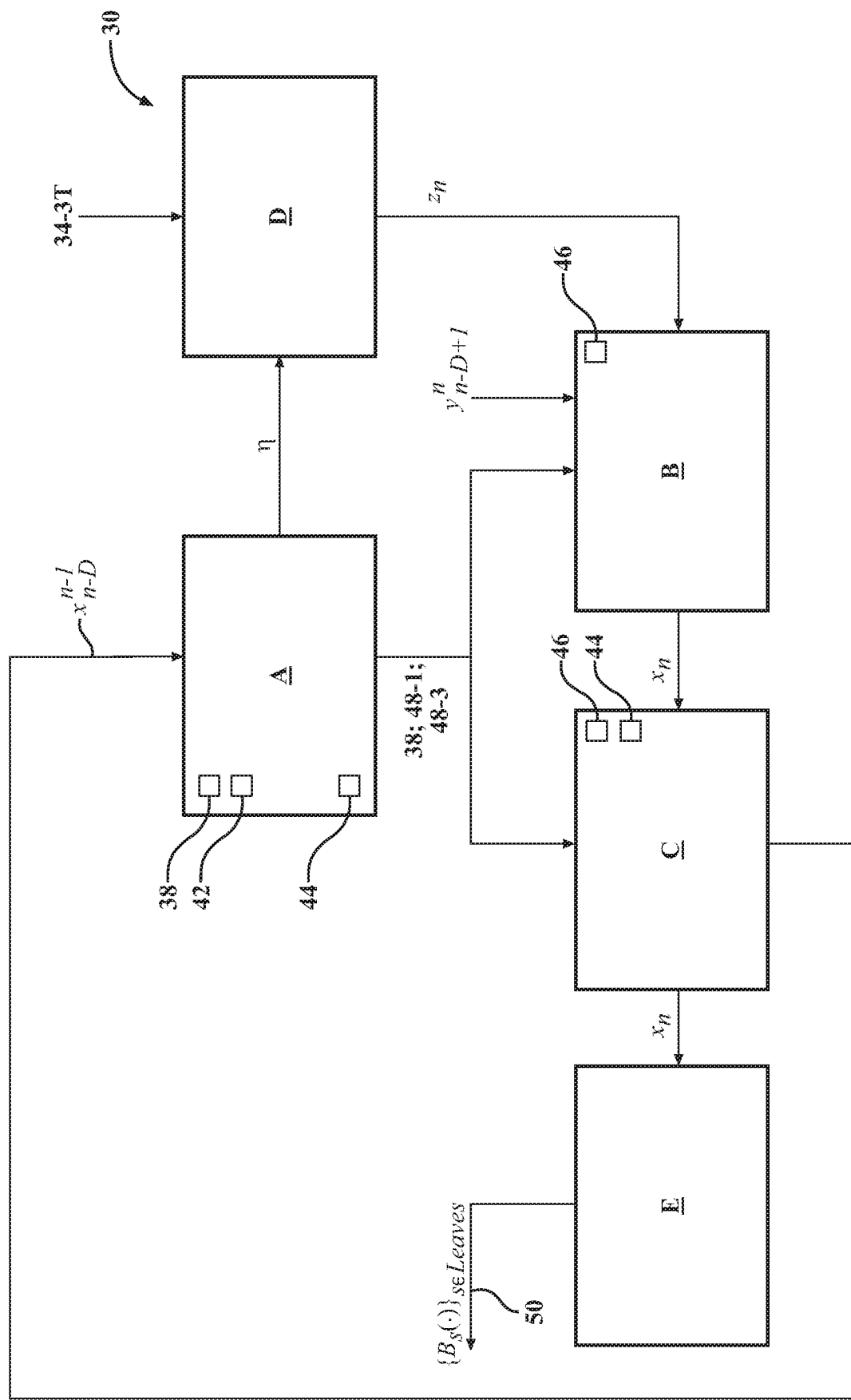
FIG. 8 is a schematic depiction of the decoder using the CTW compression algorithm to construct decoding primary and secondary CTW data structures, and generating likelihood vectors and determining cardinality and mapping, respectively, shown in FIG. 6, according to the disclosure.

Formulation of the mapping function 38 is accomplished in box E shown in FIG. 8. To formulate the mapping function 38, the electronic controller 30 may be additionally configured to enumerate a number of appearances of current data symbol $x_n$ in the first data sequence 24-1 for a context of the first data sequence 24-1 and a context of the second data sequence 24-2 in a decoding secondary context tree data structure 46 (by observing their decoded versions, $2\widehat{4-}1$ and $2\widehat{4-}2$, which are approximately equal to the original). Thus, the controller 30 may search for the specific data symbol $x_n$ in the first data sequence 24-1 for a given pair of contexts in the first and second data sequences 24-1, 24-2 by similarly observing their decoded versions, $2\widehat{4-}1$ and $2\widehat{4-}2$). To formulate the mapping function 38, the electronic controller 30 may be further configured to use the decoding secondary context tree data structure 46, i.e., the determined statistical correlation 36, to satisfy or fit a target error probability 54, i.e., a target probability of decoding error. The selected target error probability 54 is intended to provide a workable compromise between data compression and decoding accuracy.

For illustrative purposes, the following exemplary mapping $\{x_1, x_2, x_3\} \rightarrow$ bin 4 is considered. In the above instance, the decoding will then also be based on the value of the decoded fourth sequence $2\widehat{4-}4$. In other words, when receiving the symbol corresponding to bin number 4, the decoding will be affected as follows for different contexts in $2\widehat{4-}4$: equaling to $y_1$, $y_2$ or $y_3$:

$y_1 \rightarrow x_1$,
$y_2 \rightarrow x_2$,
$y_3 \rightarrow x_3$

However, in such an instance, a decoding error may appear when the symbol in the decoded fourth sequence $2\widehat{4-}4$ is $y_1$, but the symbol in the third data sequence 24-3 was actually $x_2$. The probability of error in such a case may be determined based on the enumerations performed. Specifically, the probability of error may be calculated empirically for a given mapping, wherein enumerations of the appearances of a particular data symbol are indicative of the subject probability.

In each data sequence, multiple input symbols may be distinct from each other within an average error probability 56 over the entire first data sequence 24-1. If the resultant average error probability 56 is found to exceed the target error probability 54, it is indicative of the formulated binning function 38 being insufficient to compress the data with the appropriate level of accuracy. In other words, using such a deficient binning function 38 would permit too many values to be mapped into a common bin (e.g., 39A shown in FIG. 3). To rectify the above, some of the data values mapped into a common bin would need to be split up between separate bins, which will reduce the effective probability of error. Yet, when the target error probability 54 criterion is satisfied, using the mapping function 38 may permit multiple input data symbols to be mapped into a common bin (e.g., 39A shown in FIG. 3, mapping several values to bin $b_1$). Consequently, the average error probability 56 is intended to be less than or equal to the target error probability 54. The average error probability 56 may be calculated empirically (for a given mapping and the current observed data sequences) based on the enumerations performed for a given mapping.

Figure 5:
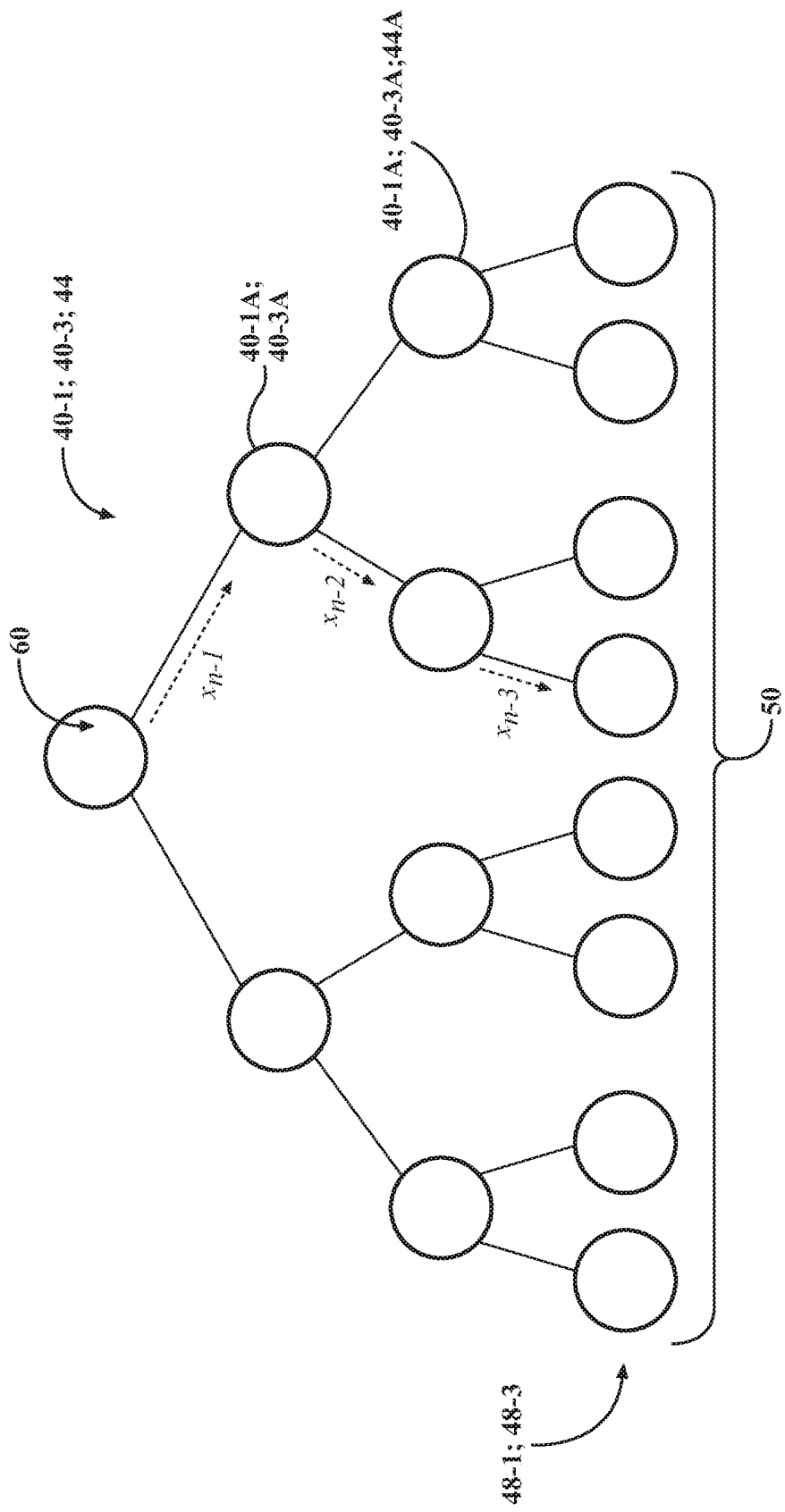
FIG. 5 is a depiction of evaluation of a context tree weighted (CTW) data structure, specifically illustrating appearance of a symbol $x_n$ at each node of a primary context tree weighted (CTW) data structure for use in the compression algorithm of the first processor (encoder). An analogous CTW data structure is constructed for decoding in the electronic controller (decoder).

As shown in FIG. 5, to determine the third data sequence 24-3, the electronic controller 30 may be configured to descend through the decoding primary context tree data structure 44. Descending through the decoding primary context tree data structure 44 is undertaken to reach a particular leaf 50 having the mapping function 38 for mapping each data symbol in the third data sequence 24-3 (the data sequence $x_{(t+1)}^{M}$) to a respective bin value in the transformed third data sequence 24-3T (the data sequence $z_{(t+1)}^{M}$). The descent through the decoding primary context tree data structure 44 is generally required for the decoding of encoded transformed sequence 34-3T, and to reach one of the leaves 50 in the decoding primary context tree data structure 44, which contains the currently used transformation, to facilitate extraction of the third data sequence 24-3 from its transformed version 24-3T. The electronic controller 30 may be further configured to descend through the secondary context tree data structure 46 according to the current context of the decoded fourth data sequence $2\widehat{4-}4$ to establish, i.e., determine, a value of the current data symbol $x_n$ in the third data sequence 24-3. Thus, the determined value of the current data symbol $x_n$ in the sequence $x_{(t+1)}^{M}$ signifies the highest probability value for the current symbol in the third data sequence 24-3.

Following the determination of the value of current data symbol $x_n$ in the sequence $x_{(t+1)}^{M}$, the electronic controller 30 may proceed to update the decoding secondary context tree data structure 46 corresponding to the specific leaf 50 in the decoding primary context tree data structure 44 (the specific leaf that was reached in the descent through the decoding primary context tree according to the context in the decoded third data sequence $2\widehat{4-}3$). The updating of the secondary context tree data structure 46 may be accomplished by incrementing the enumerator corresponding to the value of $x_n$ in each the node 46A going up the decoding secondary context tree data structure 46 from the leaf of the secondary tree (one of the leaves 52 shown in FIG. 6) that corresponds to the context in the decoded fourth data sequence $2\widehat{4-}4$. Each node in the first and third encoding primary context tree data structures 40-1, 40-3, decoding primary context tree data structure 44, and decoding secondary context tree data structure 46 may include a counter 60 to facilitate determining the number of times the data symbol $x_n$ appears in the respective context tree data structure. In the primary context tree data structure 40-3, the counter 60 enumerates the bin values rather than the original symbols, but otherwise the primary structure follows the CTW algorithm 42. In the secondary context tree data structure 46, the respective counters 60 enumerate, but do not calculate the conditional likelihood ratios R, $R_T$.

The correlation between the first and second sensors 20, 22 learned by the electronic controller 30 (highest probability value for the current data symbols $x_n$ in the third data sequence 24-3) will be fed back to the first processor 26, thus setting the framework for future encoding-decoding via the data gathering and processing system 18. Therefore, following the determination of correlation between the first and second sensors 20, 22 by the electronic controller 30, the first sensor 22 may communicate less information, since complementary information will be received from other sensors, such as the second sensor 22.

Figure 9:
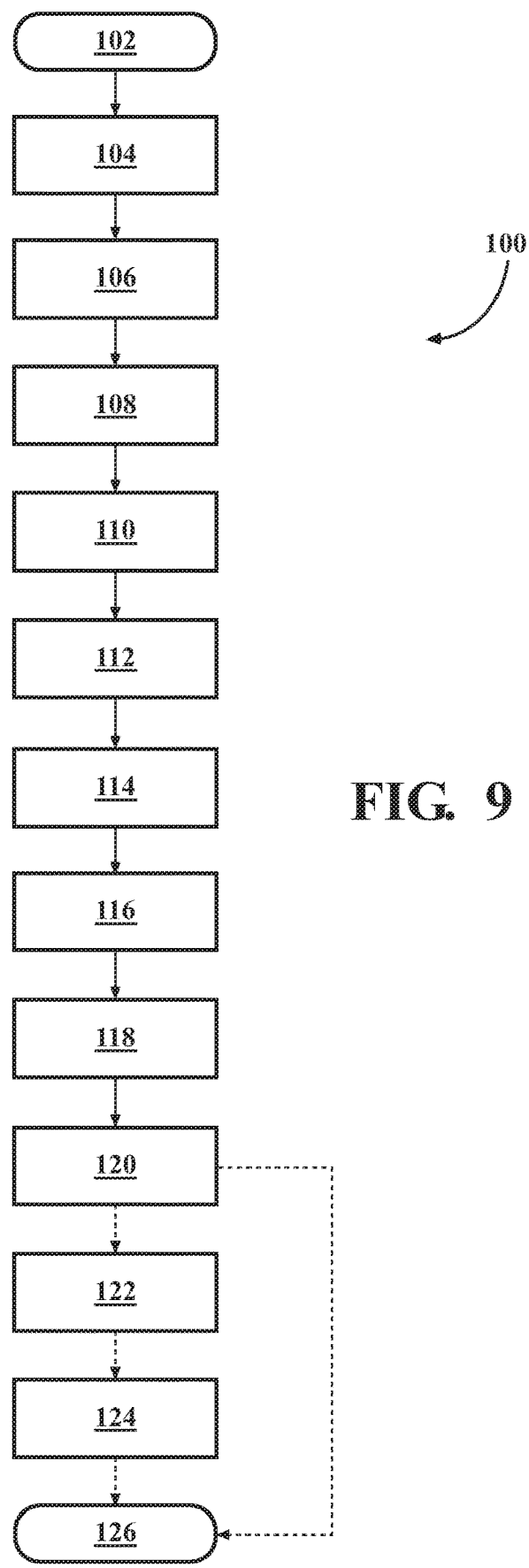
FIG. 9 is a flow diagram of a method of near-lossless universal data compression using correlated data sequences generated by multiple data-sources shown in FIGS. 1-8, according to the present disclosure.

FIG. 9 depicts a method 100 of near-lossless universal data compression using correlated data sequences generated by multiple data-sources, such as the first and second sensors 20, 22 used by the vehicle data gathering and processing system 18, as described above with respect to FIGS. 1-8. The method 100 may be performed via the system 18 utilizing the electronic controller 30 programmed with respective data compression algorithms. The method 100 initiates in frame 102 with the vehicle 10 situated relative to or physically traversing the first target surroundings 14 and the second target surroundings 15. Following frame 102, the method proceeds to frame 104, where the method includes detecting, via the first sensor 20, the first target surroundings 14 proximate the vehicle 10.

After frame 104, the method advances to frame 106. In frame 106 the method includes encoding, via the first processor 26, the first data sequence 24-1 indicative of the first target surroundings 14 detected by the first sensor 20. As described above with respect to FIGS. 1-8, encoding via the first processor 26 may include using the CLAY compression algorithm 42 to construct the encoding primary context tree data structure 40-1. Also, decoding via the electronic controller 30 includes using the CTW compression algorithm 42 to construct the decoding primary context tree data structure 44. Following frame 106, the method proceeds to frame 108.

In frame 108 the method includes communicating, via the first processor 26, the encoded first data sequence 34-1 to the electronic controller 30. Following frame 108, the method moves on to frame 110. In frame 110, as described above with respect to FIGS. 1-8, the method includes detecting the first target surroundings 14 via the second sensor 22. After frame 110, the method advances to frame 112. In frame 112 the method includes encoding the second data sequence 24-2, via the second processor 28, to generate the encoded second data sequence 34-2 indicative of the first target surroundings 14 detected by the second sensor 22. Following frame 112 the method proceeds to frame 114. In frame 114 the method includes communicating, via the second processor 28, the encoded second data sequence 34-2 to the electronic controller 30. After frame 114, the method advances to frame 116.

In frame 116 the method includes decoding, via the electronic controller 30, the encoded first data sequence 34-1 and the encoded second data sequence 34-2. After frame 116, the method proceeds to frame 118. In frame 118, the method includes determining, via the electronic controller 30, the statistical correlation 36 between the decoded first data sequence $2\widehat{4-1}$ and the decoded second data sequence $2\widehat{4-2}$ and formulating, via the controller, the mapping function 38 having reduced cardinality and indicative of the determined statistical correlation. Specifically, determining the statistical correlation 36 may include constructing the decoding secondary context tree data structure 46 from each leaf 50 of the decoding primary context tree data structure 44. After frame 118, the method advances to frame 120. In frame 120 the method includes feeding back, via the electronic controller 30, the mapping function 38 to the first processor 26. After frame 120, the method may advance to frame 122.

In frame 122 the method includes detecting the second target surroundings 15 via the first sensor 20. In frame 122 the method also includes transforming, via the first processor 26, the third data sequence 24-3 indicative of the second target surroundings 15 using the mapping function 38 to thereby generate the encoded transformed third data sequence 34-3T. Specifically, encoding each of the first and third data sequences 24-1, 24-3 may include constructing respective first and third encoding primary context tree data structures 40-1, 40-3. Encoding the first data sequence 24-1 may be configured to generate a conditional likelihood ratio R for each data symbol in the first data sequence. Transforming the third data sequence via the first processor 26 may use, at each leaf 48-3 of the third encoding primary context tree data structure 40-3, the respective mapping function 38, which transforms the symbols of the third data sequence 24-3. Additionally, as described above with respect to FIGS. 1-8, in frame 122 the method includes encoding, via the first processor 26, the transformed third data sequence 24-3T to generate the encoded transformed third data sequence 34-3T. Specifically, encoding the transformed third data sequence 24-3T may be configured to generate a conditional likelihood ratio $R_T$ for each data symbol in the transformed third data sequence 34-3T using the third encoding primary context tree data structure 40-3. After frame 122, the method may proceed to frame 124.

In frame 124 the method includes detecting the second target surroundings 15 via the second sensor 22. In frame 124 the method also includes encoding the fourth data sequence 24-4, via the second processor 28, indicative of the second target surroundings 15 detected by the second sensor 22. In frame 124 the method additionally includes communicating to the electronic controller 30 the encoded transformed third data sequence 34-3T via the first processor 26 and the encoded fourth data sequence 34-4 via the second processor 28. In frame 124 the method further includes, via the electronic controller 30, decoding the encoded transformed third data sequence 34-3T and the encoded fourth data sequence 34-4, and then determining the third data sequence 24-3 using the decoded transformed third data sequence $2\widehat{4-3}$ T and the decoded fourth data sequence $2\widehat{4-4}$.

As described above with respect to FIGS. 1-8, decoding the encoded transformed third data sequence 34-3T may include using the CTW compression algorithm 42 to construct the decoding primary context tree data structure 44. Additionally, determining the third data sequence 24-3 may include using the constructed decoding primary context tree data structure 44 and the constructed decoding secondary context tree data structure 46 for every leaf 50 of the decoding primary context tree data structure via the electronic controller 30. Determining the third data sequence 24-3 may also include using the decoded fourth data sequence $2\widehat{4-}4$ and the decoding secondary context tree data structure 46.

Formulating the mapping function 38 may include enumerating a number of appearances of the current data symbol $x_n$ in the first data sequence 24-1 for the context of the first data sequence and the context of the second data sequence 24-2 in a decoding secondary context tree data structure 46. Formulating the mapping function 38 may additionally include using the secondary context tree data structure 46 to achieve the average error probability 56 that is less than or equal to the target error probability 54. Achieving the target probability 54 of decoding error facilitates mapping multiple input symbols into the common bin 39A, when, using each of the primary and secondary context tree data structures 44, 46, the multiple input symbols are distinct from each other within the average probability 56 of decoding error over the entire first data sequence 24-1.

As described above with respect to FIGS. 1-8, determining the third data sequence 24-3 may further include descending through the decoding primary context tree data structure 44 to reach the leaf 50 having the mapping function 38. Such descending through the decoding primary context tree data structure 44 is intended to facilitate mapping each data symbol $x_n$ in the third data sequence 24-3 to the respective bin value in the transformed third data sequence 24-3T. First the encoded transformed third data sequence 34-3T is decoded and then the relevant leaf 50 is reached to finalize the decoding of the third data sequence 24-3. Specifically, descending through the secondary context tree data structure 46 according to the current context of the decoded fourth data sequence $2\widehat{4-}4$ may be undertaken in frame 124 to establish a value of the current data symbol $x_n$ in the third data sequence 24-3. Following either frame 120 or frame 124 the method may return to frame 104. The method 100 may thus continuously update and use the first processor 26 to more effectively process and compress raw data newly gathered by the vehicle's first and second sensors 20, 22. Alternatively, following either frame 120 or frame 124 the method may conclude in frame 126.

Once every k number of iterations, the method 100 may revert to the beginning, i.e., frame 102, where the mapping functions are initialized and started anew, so as not to propagate errors. In other words, the mapping functions and the decoding secondary tree data structure 46 enumerations may be initialized, but the data sequences are not transformed in the first and second processors 26, 28, such that each communicated sequence is an encoded versions of a raw, untransformed sequence. Accordingly, the electronic controller 30 does not presuppose statistical dependency between the first and second sensors 20, 22, thus enabling enumeration in the decoding secondary tree data structure 46 to start anew.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

What is claimed is:

1. A method of near-lossless universal data compression using correlated data sequences generated by multiple sensors, the method comprising:
    detecting first target surroundings, via a first sensor;
    encoding, via a first processor, a first data sequence indicative of the first target surroundings detected by the first sensor;
    communicating, via the first processor, the encoded first data sequence to an electronic controller;
    detecting the first target surroundings via a second sensor;
    encoding a second data sequence, via a second processor, indicative of the first target surroundings detected by the second sensor;
    communicating, via the second processor, the encoded second data sequence to the electronic controller;
    decoding, via the electronic controller, the encoded first data sequence and the encoded second data sequence;
    determining, via the electronic controller, a statistical correlation between the decoded first data sequence and the decoded second data sequence and formulating, via the electronic controller, a mapping function having reduced cardinality and indicative of the determined statistical correlation; and
    feeding back, via the electronic controller, the mapping function to the first processor.

2. The method according to claim 1, further comprising:
    detecting second target surroundings via the first sensor;
    transforming, via the first processor, a third data sequence indicative of the detected second target surroundings using the mapping function; and
    encoding, via the first processor, the transformed third data sequence.

3. The method according to claim 2, wherein the transformed third data sequence is at a lower data cardinality as compared to the third data sequence, and thereby a size of the encoded transformed third data sequence is smaller than a size of encoded third data sequence.

4. The method according to claim 2, further comprising:
    communicating, via the first processor, the encoded transformed third data sequence to the electronic controller;
    detecting the second target surroundings via the second sensor;
    encoding a fourth data sequence, via the second processor, indicative of the second target surroundings detected by the second sensor;
    communicating, via the second processor, the encoded fourth data sequence to the electronic controller;
    decoding, via the electronic controller, the encoded transformed third data sequence and the encoded fourth data sequence; and
    determining, via the electronic controller, the third data sequence using the transformed third data sequence and the decoded fourth data sequence.

5. The method according to claim 4, wherein:
    encoding via the first processor includes using a context tree weighted (CTW) compression algorithm to construct an encoding primary context tree data structure;
    decoding via the electronic controller includes using the CTW compression algorithm to construct a decoding primary context tree data structure; and determining the statistical correlation between the decoded first data sequence and the decoded second data sequence includes constructing, via the electronic controller, a decoding secondary context tree data structure from each leaf of the decoding primary context tree data structure.

6. The method according to claim 5, wherein:
encoding each of the first data sequence and the third data sequence includes constructing respective first and third encoding primary context tree data structures;
encoding the first data sequence is configured to generate a conditional likelihood ratio for each data symbol in the first data sequence;
transforming the third data sequence uses, at each leaf of the third encoding primary context tree data structure, the respective mapping function, which transforms the symbols of the third data sequence; and
encoding the transformed third data sequence is configured to generate a conditional likelihood ratio for each data symbol in the transformed third data sequence using the third encoding primary context tree data structure.

7. The method according to claim 5, wherein:
decoding the encoded transformed third data sequence includes using the CTW compression algorithm to construct the decoding primary context tree data structure; and
determining the third data sequence includes using the constructed decoding primary context tree data structure and the constructed decoding secondary context tree data structure for each leaf of the decoding primary context tree data structure.

8. The method according to claim 7, wherein:
formulating the mapping function includes enumerating a number of appearances of a current data symbol in the first data sequence for a context of the first data sequence and a context of the second data sequence in a decoding secondary context tree data structure; and
formulating the mapping function includes using the decoding secondary context tree data structure to achieve a target error probability, and thereby facilitating mapping multiple input symbols into a common bin, when, using each of the primary and secondary context tree data structures, the multiple input symbols are distinct from each other within an average, over the entire first data sequence, error probability that is less than or equal to the target error probability.

9. The method according to claim 7, wherein:
decoding the encoded transformed third data sequence includes constructing the decoding primary context tree data structure; and
determining the third data sequence additionally includes using the decoded fourth data sequence and the decoding secondary context tree data structure.

10. The method according to claim 9, wherein determining the third data sequence additionally includes descending through the decoding primary context tree data structure to reach a leaf having the mapping function for mapping each data symbol in the third data sequence to a respective bin value in the transformed third data sequence, the method further comprising descending through the secondary context tree data structure according to the current context of the decoded fourth data sequence to establish a value of a current data symbol in the third data sequence.

11. A system for near-lossless universal data compression using correlated data sequences generated by multiple sensors, the system comprising:
a first sensor configured to detect first target surroundings;
a first processor configured to encode a first data sequence indicative of the first target surroundings detected by the first sensor and communicate the encoded first data sequence to an electronic controller;
a second sensor configured to detect the first target surroundings; and
a second processor configured to encode a second data sequence indicative of the first target surroundings detected by the second sensor and communicate the encoded second data sequence to the electronic controller;
wherein the electronic controller is configured to:
decode the encoded first data sequence and the encoded second data sequence;
determine a statistical correlation between the decoded first data sequence and the decoded second data sequence;
formulate a mapping function having reduced cardinality and indicative of the determined statistical correlation; and
feed back the mapping function to the first processor.

12. The system according to claim 11, wherein:
the first sensor is further configured to detect second target surroundings; and
the first processor is further configured to:
transform a third data sequence indicative of the detected second target surroundings using the mapping function; and
encode the transformed third data sequence.

13. The system according to claim 12, wherein the transformed third data sequence is at a lower data cardinality as compared to the third data sequence, and thereby a size of the encoded transformed third data sequence is smaller than a size of encoded third data sequence.

14. The system according to claim 12, wherein:
the first processor is further configured to communicate the encoded transformed third data sequence to the electronic controller;
the second sensor is further configured to detect the second target surroundings;
the second processor is further configured to encode a fourth data sequence indicative of the second target surroundings detected by the second sensor and communicate the encoded fourth data sequence to the electronic controller; and
the electronic controller is further configured to:
decode the encoded transformed third data sequence and the encoded fourth data sequence; and
determine the third data sequence using the transformed third data sequence and the decoded fourth data sequence.

15. The system according to claim 14, wherein:
the first processor is configured to encode via using a context tree weighted (CTW) compression algorithm to construct an encoding primary context tree data structure;
the electronic controller is further configured to:
decode via using the CTW compression algorithm to construct a decoding primary context tree data structure; and
determine the statistical correlation between the decoded first data sequence and the decoded second data sequence via constructing a decoding secondary context tree data structure from each leaf of the decoding primary context tree data structure.

16. The system according to claim 15, wherein the first processor is further configured to:
  encode each of the first data sequence and the third data sequence via constructing respective first and third encoding primary context tree data structures;
  encode the first data sequence to generate a conditional likelihood ratio for each data symbol in the first data sequence;
  transform the third data sequence via using, at each leaf of the third encoding primary context tree data structure, the respective mapping function to thereby transform the symbols of the third data sequence; and
  encode the transformed third data sequence using the third encoding primary context tree data structure to generate a conditional likelihood ratio for each data symbol in the transformed third data sequence.

17. The system according to claim 15, wherein the electronic controller is configured to:
  decode the encoded transformed third data sequence using the CTW compression algorithm to construct the decoding primary context tree data structure; and
  determine the third data sequence using the constructed decoding primary context tree data structure and the constructed decoding secondary context tree data structure for each leaf of the decoding primary context tree data structure.

18. The system according to claim 17, wherein to formulate the mapping function, the electronic controller is further configured to:
  enumerate a number of appearances of a current data symbol in the first data sequence for a context of the first data sequence and a context of the second data sequence in a decoding secondary context tree data structure; and
  use the decoding secondary context tree data structure to achieve a target error probability, and thereby facilitate mapping multiple input symbols into a common bin, when, using each of the primary and secondary context tree data structures, the multiple input symbols are distinct from each other within an average, over the entire first data sequence, error probability that is less than or equal to the target error probability.

19. The system according to claim 17, wherein the electronic controller is further configured to:
  decode the encoded transformed third data sequence via constructing the decoding primary context tree data structure; and
  determine the third data sequence additionally via using the decoded fourth data sequence and the decoding secondary context tree data structure.

20. The system according to claim 19, wherein:
  to determine the third data sequence, the electronic controller is configured to descend through the decoding primary context tree data structure to each a leaf having the mapping function for mapping each data symbol in the third data sequence to a respective bin value in the transformed third data sequence; and
  the electronic controller is further configured to descend through the secondary context tree data structure according to the current context of the decoded fourth data sequence to establish a value of a current data symbol in the third data sequence.

* * * * *